United States Patent [19]

Guritz

[11] 4,142,118
[45] Feb. 27, 1979

[54] INTEGRATED CIRCUIT WITH POWER SUPPLY VOLTAGE LEVEL DETECTION

[75] Inventor: Elmer H. Guritz, Dallas, Tex.

[73] Assignee: Mostek Corporation, Carrollton, Tex.

[21] Appl. No.: 825,602

[22] Filed: Aug. 18, 1977

[51] Int. Cl.² .............................................. H03K 3/00
[52] U.S. Cl. ..................................... 307/358; 328/147
[58] Field of Search .................... 307/200 B, 358, 363; 330/253; 328/48, 147, 148

[56] References Cited

U.S. PATENT DOCUMENTS

| | | | |
|---|---|---|---|
| 3,105,939 | 10/1963 | Onno et al. | 328/34 |
| 3,676,783 | 7/1972 | Kinbara et al. | 328/147 X |
| 3,733,498 | 5/1973 | Watson | 307/350 X |
| 3,894,247 | 7/1975 | De Jong | 307/208 |
| 3,975,648 | 8/1976 | Tobey, Jr. et al. | 307/296 X |

Primary Examiner—James B. Mullins
Attorney, Agent, or Firm—James J. Mullen

[57] ABSTRACT

An MOS integrated circuit includes internal circuitry for detecting the voltage level of an external power supply. The internal circuitry comprises networks for producing two reference voltages, each of which varies with supply voltage in a different but predictable manner such that when the reference voltages are equal, the supply voltage is at a sufficiently high level to assure the generation of valid logic levels. As the supply voltage increases beyond such level, the two reference voltages diverge in value, detection of which is achieved with a different amplifier. Circuitry responsive to the output of the differential amplifier gives a positive indication of sufficient supply voltage to other circuit portions of the integrated circuit device.

10 Claims, 15 Drawing Figures

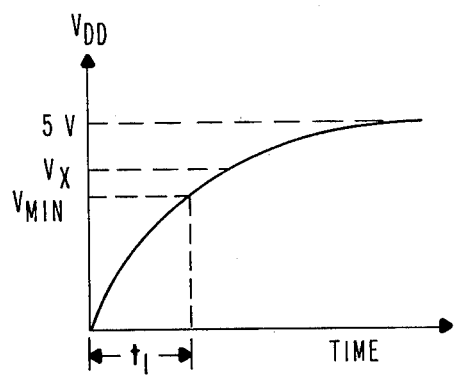
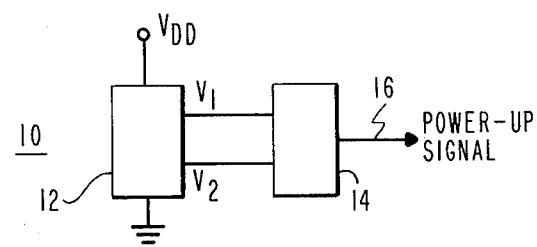
FIG. 1    FIG. 2
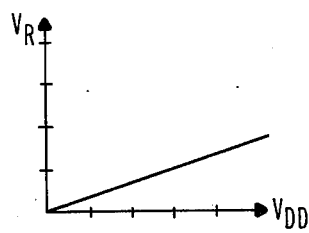
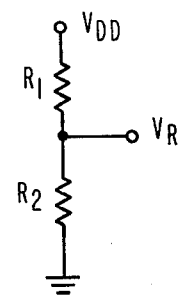
FIG. 3    FIG. 3a
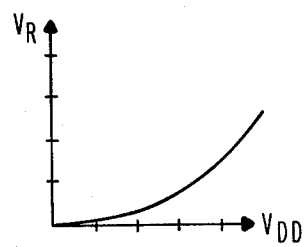
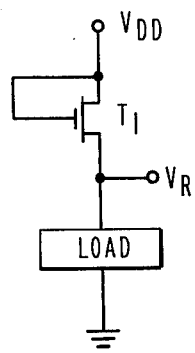
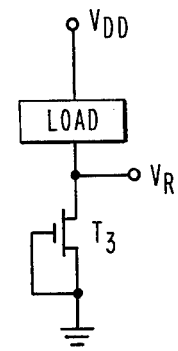
FIG. 4    FIG. 4a    FIG. 4b
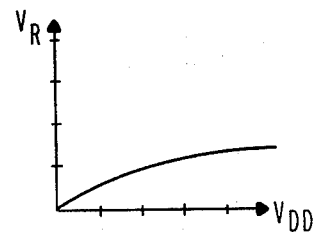
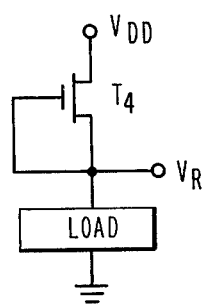
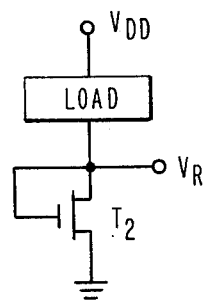
FIG. 5    FIG. 5a    FIG. 5b

INTEGRATED CIRCUIT WITH POWER SUPPLY VOLTAGE LEVEL DETECTION

BACKGROUND OF THE INVENTION

The present invention pertains to integrated circuits, and particularly to MOS/LSI circuits.

The generation of valid logic signals in integrated circuits depends in part on the maintenance of power supply voltages within specified limits. In more complex integrated circuits it is important to be able to sense internally whether the external voltage being supplied is sufficient for reliable operation.

In TTL integrated circuit devices, it is a relatively simple task to establish a reference voltage by means of a zener diode, such that the integrated circuit becomes operable when the power supply voltage exceeds the reference voltage. Unfortunately, the zener diode is not available as a practical matter in MOS integrated circuit devices. Therefore, alternative means must be employed in MOS devices for assuring that adequate voltage levels are being supplied.

One technique that is successful in certain MOS integrated circuit applications is the use of delay circuitry that causes the integrated circuit to remain inoperable for some period of time after the onset of power. Such a technique depends for its success on a correct assumption about the rise time of the external power supply, and therefore should be used only in applications where the consequences of an incorrect assumption can be tolerated. For example, some pocket calculators operate on such a delay principle. If the calculator powers up improperly, it can be cleared manually. Such delay circuit techniques, however, are unsatisfactory for integrated circuit devices that cannot tolerate the risk of premature operation that would occur if the power supply failed to reach a sufficient voltage level within the delay time. The microcomputer is one such device.

A single chip MOS/LSI microcomputer is disclosed in commonly assigned U.S. Patent Application Ser. No. 815,932, filed July 15, 1977. Because the microcomputer has such great versatility, it must be able to perform correctly in many different applications, some of which cannot tolerate the generation of improper logic signals under any conditions, including start-up. Furthermore, since the microcomputer operates under the direction of an internally stored program, it is most important that information processing begin at the appropriate starting point in the program's instruction set. It will be appreciated that the generation of false signals during start-up could prevent proper program execution.

Accordingly, the present invention provides internal circuitry for use in MOS/LSI integrated circuit devices, particularly microcomputers, that will give a positive indication that the external power supply has reached a minimum specified voltage level, without regard to rise time.

SUMMARY OF THE INVENTION

In accordance with the present invention, an integrated circuit is equipped with circuitry for detecting the voltage level being supplied by an external power supply such that a signal is generated internally when the supply voltage exceeds a predetermined voltage level. The predetermined voltage level is selected to assure that sufficient voltage is being supplied to the integrated circuit for reliable operation of internal circuits that depend upon valid logic level voltages. Reference voltages that have a functional relationship to the supply voltage are used to provide a positive indication to other internal circuit portions that the supply voltage has exceeded the predetermined voltage.

The novel features believed characteristic of the invention are set forth in the appended claims. The nature of the invention, however, as well as its essential features and advantages, may be understood more fully upon consideration of an illustrative embodiment when read in conjunction with the accompanying drawings wherein:

BRIEF DESCRIPTION OF THE DRAWINGS

FIG. 1 is a graph illustrating the voltage during start-up of a typical power supply used in conjunction with devices of the present invention;

FIG. 2 is a circuit block diagram illustrating the operation of the present invention;

FIGS. 3–5 illustrate general characteristics of various reference voltages as a function of power supply voltage for use with the present invention;

FIG. 3a illustrates a circuit for implementing the reference voltage characteristic of FIG. 3;

FIGS. 4a–c illustrate circuits for implementing the reference voltage characteristic of FIG. 4;

FIGS. 5a and 5b illustrate circuits for implementing the reference voltage characteristic of FIG. 5;

DESCRIPTION OF THE PREFERRED EMBODIMENTS

Figure 4C:
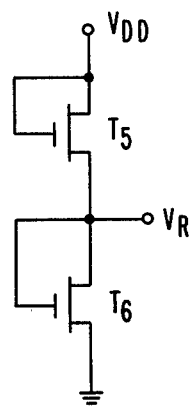

FIG. 1 graphically depicts a typical power-up curve for a power supply used in conjunction with an integrated circuit device of the present invention. The power supply voltage is designated as $V_{DD}$ in accordance with conventional MOS/LSI parameter nomenclature. Since the power supply is external to the integrated circuit device, the rise time of $V_{DD}$ as a practical matter is an unknown. In order for the integrated circuit to generate valid logic signals upon which its internal operation depends, $V_{DD}$ must first reach some minimum voltage level $V_{MIN}$ on its way to its steady-state value, which in this example is nominally five volts. Typical MOS integrated circuits will generate valid logic signals when $V_{DD}$ exceeds a $V_{MIN}$ of about 3.5 volts. The time $t_1$ it takes the power supply to reach $V_{MIN}$ varies with equipment and operating conditions, and is therefore not a reliable parameter upon which to trigger the operation of the integrated circuit. Thus, it becomes necessary in applications where premature operation cannot be tolerated, that initial operation be triggered only when $V_{DD}$ has risen to some predetermined voltage, designated as $V_X$, which safely exceeds $V_{MIN}$. The present invention provides a reliable circuit that detects when $V_{DD}$ has risen above $V_X$ and then generates a signal for triggering operation of an MOS integrated circuit of which the inventive circuit is a part.

FIG. 2 illustrates such a detecting and signal generating circuit, indicated generally by reference numeral 10. The circuit 10 has a first portion 12, which is responsive to the power supply voltage $V_{DD}$ and which comprises circuitry for producing two reference voltages, designated $V_1$ and $V_2$. The circuit portion 12 is constructed so that $V_1$ will exceed $V_2$ when $V_{DD}$ is less than $V_X$, and $V_2$ will exceed $V_1$ when $V_{DD}$ is greater than $V_X$. A second portion 14 of the circuit 10 is constructed to detect the condition wherein $V_2$ exceeds $V_1$ and thereupon generate a power-up signal 16, which may then be used to trigger other circuitry (not shown) of the integrated circuit device.

Using different combinations of basic MOS elements, various reference voltages with different functional relationships to $V_{DD}$ can be produced. FIG. 3 depicts a first general characteristic type in which a reference voltage $V_R$ has a linear rate of rise with increasing $V_{DD}$. FIG. 4 depicts a second general characteristic type in which $V_R$ has an increasing rate of rise with increasing $V_{DD}$. FIG. 5 depicts a third general characteristic type in which $V_R$ has a decreasing rate of rise with increasing $V_{DD}$. Any two of these three characteristic curves or other similar curves may be selected to produce the reference voltages $V_1$ and $V_2$ as will be described more fully below.

The linear characteristic shown in FIG. 3 can be produced using a resistive network such as that depicted in FIG. 3a. Resistors $R_1$ and $R_2$ may be formed in accordance with known techniques, preferably using polycrystalline silicon strips of varying lengths to achieve the desired relationship. The resistors $R_1$ and $R_2$ are connected across $V_{DD}$ and circuit ground with the reference voltage $V_R$ taken off between them as shown.

The two nonlinear characteristics shown in FIGS. 4 and 5 can be produced by various circuit networks, examples of which are shown in FIGS. 4a, 4b, 4c 5a, and 5b. Each of these networks, which are connected across $V_{DD}$ and circuit ground, comprises at least one field-effect transistor in series with a load device with $V_R$ taken off therebetween as shown. The load device, which may be either a resistor or another field-effect transistor, has an impedance selected to produce the desired curve shape for $V_R$ as a function of $V_{DD}$. Various arrangements of field-effect transistors and load devices are possible, the final circuit implementation depending upon the desired $V_R$ response.

In particular, a $V_R$ characteristic with an increasing rate of rise may be conveniently produced by the circuits of FIGS. 4a–c; and a $V_R$ characteristic with a decreasing rate of rise may be conveniently produced by the circuits of FIGS. 5a or 5b. The field-effect transistors may be connected in any suitable manner, as for example with their gates coupled to their drains as depicted by transistors $T_1$, $T_2$, $T_5$ and $T_6$, in which case they may operate either in the enhancement mode or in the depletion mode. If the field-effect transistors are connected with their gates coupled to their sources as exemplified by transistors $T_3$ and $T_4$, they must operate in the depletion mode in order that they will turn on, as will be appreciated by those skilled in the art.

It is to be understood that variation of the characteristics of the transistors $T_5$, $T_6$ in FIG. 4c can produce variations between the curves of FIG. 4 and FIG. 5.

Figure 6:
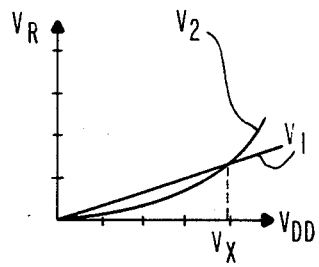
FIGS. 6–8 illustrate pairs of combinations of reference voltage characteristics for use with the present invention.
Figure 7:
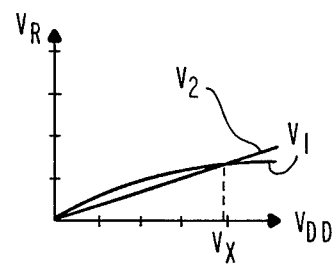
Figure 8:
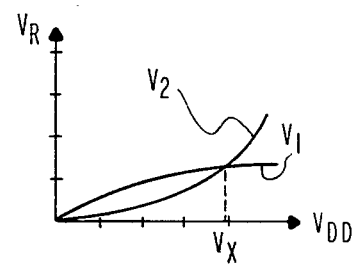

FIGS. 6, 7, and 8 illustrate the manner in which two reference voltages of different characteristic types may be employed to enable the determination that $V_{DD}$ has exceeded the predetermined value of $V_X$ needed for reliable operation of an MOS integrated circuit. In each case the circuits that produce the reference voltages $V_1$ and $V_2$ have elements of selected types and sizes that cause the two curves to cross when $V_{DD}$ has risen to $V_X$. In FIG. 6, a linear reference voltage $V_1$ is employed with a nonlinear reference voltage $V_2$ of the type having an increasing rate of rise. In FIG. 7, a nonlinear reference voltage $V_1$ of the type having a decreasing rate of rise is employed with a linear reference voltage $V_2$. In FIG. 8, the reference voltages $V_1$ and $V_2$ have nonlinear characteristics.

In the presently most preferred embodiment of the invention, the technique of FIG. 6 is employed since the corresponding characteristics are most readily controllable using present techniques. In other words, the variation of the crossover point, which determines $V_X$, can be held in a narrow range from about 3.75 volts to about 4.0 volts using the circuit of FIG. 3a to produce the reference voltage $V_1$ and the circuit of FIG. 4a to produce the reference voltage $V_2$. The above-mentioned range for $V_X$ is preferred for use in a single-chip microcomputer using N-channel silicon-gate technology. The resistors $R_1$ and $R_2$ of FIG. 3a preferably comprise polycrystalline strips whose respective lengths are in proportion to the ratio of about 6:4. In FIG. 4a, the transistor $T_1$ is preferably an enhancement mode FET, which will cause the curve of FIG. 4 to initially follow the $V_{DD}$ axis until the threshold of $T_1$ is reached. The threshold voltage is initially between about 0.1 and 0.2 volts and subsequently rises to a steady-state value of about 0.7 volts. The load device of FIG. 4a is preferably another enhancement mode FET of roughly the same size as $T_1$ also having its gate connected to its drain. Although the above transistor and resistor elements are presently preferred, the invention may successfully be practiced with any combination of elements that produce reference voltage curves that cross within an acceptable range encompassing the desired value of $V_X$.

Figure 9:
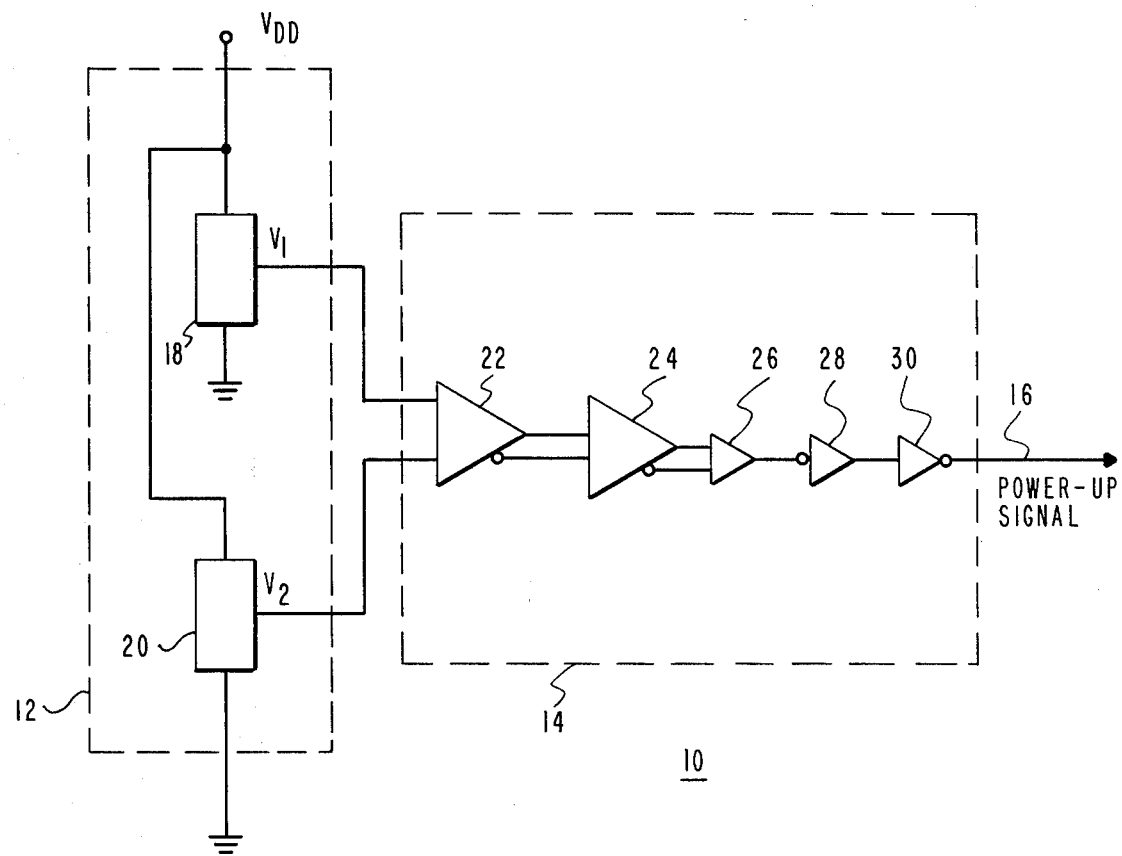
FIG. 9 illustrates additional details of the circuit of FIG. 2.

FIG. 9 illustrates additional details of a presently preferred circuit embodiment of the present invention. The circuit portion 12 for producing the reference voltages $V_1$ and $V_2$ comprises two networks, shown as circuit blocks 18 and 20. Although the networks 18 and 20 may comprise any of the possible arrangements for producing any two suitable characteristic curves, such as any two of the curves shown in FIGS. 3–5, network 18 preferably comprises the circuit of FIG. 3a and network 20 preferably comprises the circuit of FIG. 4a for better control over $V_X$ as stated above. The circuit portion 14 comprises high gain differential amplifiers 22 and 24 and circuit means responsive to the output thereof for generating the power-up signal 16. The reference voltages $V_1$ and $V_2$ provide the inputs to the first differential amplifier 22, which in turn drives the second differential amplifier 24. Such a two-stage differential amplifier arrangement is capable of quickly detecting when $V_1$ and $V_2$ pass the crossing point (illustrated in FIGS. 6–8) and providing a strong logic-signal indication thereof. The output of differential amplifier 24 is level shifted by a source follower circuit 26 to provide good logic levels. The output from circuit stage 26 is then buffered and inverted, as represented by circuit stages 28 and 30, to provide isolation and noise filtering. The resulting signal 16 generated by circuit 10 gives a positive indication that the power supply voltage $V_{DD}$ has risen beyond the predetermined level $V_X$ so that reliable operation of other circuit portions of the integrated circuit may begin. The circuit 26 is constructed so that a power-up signal 16 cannot be generated before $V_{DD}$ reaches about 1.5 to 2.0 volts regardless of the relative values of $V_1$ and $V_2$. This assures that a possible momentary crossover of the reference voltages, which might occur for various reasons at very low values of $V_{DD}$, will not produce a premature power-up signal 16. In a microcomputer integrated circuit, the power-up signal 16 may be used to clear registers, reset timing circuitry, load the first location of a stored program into an instruction register, and various other functions as will be appreciated by those skilled in the art.

Although a preferred embodiment of the invention has been described in detail, it is to be understood that various changes, substitutions and alterations may be made therein without departing from the spirit and scope of the invention as defined by the appended claims. For example, although the present invention has been described in terms of its applicability to N-channel integrated circuit devices, it will be appreciated that the present invention may also be applied to P-channel integrated circuit devices with appropriate modifications.

What is claimed is:

1. An integrated circuit device powered by an external power supply comprising:
   means responsive to the external power supply for producing a first reference voltage,
   means responsive to the external power supply for producing a second reference voltage, the first reference voltage exceeding the second reference voltage at a time when the voltage provided by the external power supply is less than a predetermined voltage, the second reference voltage exceeding the first reference voltage at a time when the voltage provided by the external power supply is greater than the predetermined voltage, and
   means for generating a signal when the second reference voltage exceeds the first reference voltage.

2. The device of claim 1 wherein the signal generating means comprises at least one differential amplifier having inputs responsive to the first and second reference voltages.

3. The device of claim 1 wherein the signal generating means comprises a first differential amplifier having inputs responsive to the first and second reference voltages, a second differential amplifier driven by the first differential amplifier, and means responsive to the second differential amplifier for generating a power-up signal to other parts of the integrated circuit.

4. The device of claim 1 wherein the first reference voltage has a linear rate of rise with increasing power supply voltage, and the second reference voltage has an increasing rate of rise with increasing power supply voltage.

5. The device of claim 4 wherein the means for producing the first reference voltage comprises a resistive voltage divider network connected between the power supply and ground, and the means for producing the second reference voltage comprises a second network having at least one field-effect transistor in series with a load, the second network being connected between the power supply and ground.

6. The device of claim 4 wherein the means for producing the first reference voltage comprises a resistive voltage divider network connected between the power supply and ground, and the means for producing the second reference voltage comprises a first enhancement mode FET having its drain and gate connected to the power supply, and a second enhancement mode FET having its source connected to ground, and the second reference voltage is provided at a node common to the source of the first enhancement mode FET and the drain and gate of the second enhancement mode FET.

7. The device of claim 6 wherein the resistive voltage divider network comprises first and second resistors formed from polycrystalline silicon strips, the lengths of which are such that the first reference voltage varies as about four-tenths of the supply voltage.

8. The device of claim 1 wherein the first reference voltage has a decreasing rate of rise with increasing power supply voltage and the second reference voltage has a linear rate of rise with increasing power supply voltage.

9. The device of claim 1 wherein the first reference voltage has a decreasing rate of rise with increasing power supply voltage, and the second reference voltage has an increasing rate of rise with increasing power supply voltage.

10. The device of claim 1 wherein the difference between the power supply voltage and ground is about five volts, and the predetermined voltage is in the range from about 3.75 volts to about 4.0 volts.

* * * * *